United States Patent [19]
Liao et al.

[11] Patent Number: 5,652,156
[45] Date of Patent: Jul. 29, 1997

[54] LAYERED POLYSILICON DEPOSITION METHOD

[75] Inventors: Siu-han Liao; Shih Jiaw-Ren, both of Hsin-Chu, Taiwan

[73] Assignee: Taiwan Semiconductor Manufacturing Company Ltd., Hsinchu, Taiwan

[21] Appl. No.: 419,050

[22] Filed: Apr. 10, 1995

[51] Int. Cl.$^6$ ................... H01L 21/20; H01L 21/3205
[52] U.S. Cl. ............... 437/40; 437/233; 437/101; 437/976; 148/DIG. 122
[58] Field of Search ..................... 437/233, 976, 437/101, 193, 40 GS, 41 GS; 148/DIG. 122

[56] References Cited

U.S. PATENT DOCUMENTS

| | | | |
|---|---|---|---|
| 4,329,706 | 5/1982 | Crowder et al. | 357/71 |
| 4,354,309 | 10/1982 | Gardiner et al. | 29/571 |
| 4,663,825 | 5/1987 | Maeda | 29/571 |
| 4,697,333 | 10/1987 | Nakahara | 437/20 |
| 5,147,820 | 9/1992 | Chittipeddi et al. | 437/193 |
| 5,175,119 | 12/1992 | Matustani | 437/41 GS |
| 5,177,569 | 1/1993 | Koyama et al. | 257/412 |
| 5,278,096 | 1/1994 | Lee et al. | 437/193 |
| 5,350,698 | 9/1994 | Huang et al. | 437/26 |
| 5,364,803 | 11/1994 | Lur et al. | 437/40 GS |
| 5,441,904 | 8/1995 | Kim et al. | 437/40 GS |

FOREIGN PATENT DOCUMENTS

| | | | |
|---|---|---|---|
| 402784A2 | 12/1990 | European Pat. Off. | 437/40 GS |
| 1-49269 | 2/1989 | Japan . | |
| 1-49268 | 2/1989 | Japan . | |
| 1-220438 | 9/1989 | Japan . | |
| 2-224223 | 9/1990 | Japan . | |
| 4-113633 | 4/1992 | Japan . | |

OTHER PUBLICATIONS

Translation of JP 2–224223 Sep. 1990.
S. Wolf & R.N. Tauber "Silicon Processing For the VLSI Era" vol. I, 1986, pp. 175–181, 198, 290–295, 325.

*Primary Examiner*—Charles L. Bowers, Jr.
*Assistant Examiner*—Leon Radomsky
*Attorney, Agent, or Firm*—George O. Saile; Rosemary L. S. Pike

[57] ABSTRACT

A method of forming a multilayered polysilicon gate which inhibits penetration of ions through the polysilicon gate to the underlying gate oxide layer is described. A gate silicon oxide layer is formed over the surface of a semiconductor substrate. A layer of amorphous silicon is grown overlying the gate silicon oxide layer. A layer of polysilicon is grown over the amorphous silicon layer wherein silicon grain boundaries of the polysilicon layer are misaligned with silicon grain boundaries of the amorphous silicon layer. The amorphous silicon and the polysilicon layers are etched away where they are not covered by a mask to form the multilayered polysilicon gate. The mismatched silicon grain boundaries of the multilayered polysilicon gate inhibit ions from penetrating through the polysilicon gate to the underlying gate oxide layer.

37 Claims, 5 Drawing Sheets

LAYERED POLYSILICON DEPOSITION METHOD

BACKGROUND OF THE INVENTION

1. Field of the Invention

The invention relates to the fabrication of integrated circuit devices, and more particularly, to a method of forming a polysilicon gate layer which inhibits the penetration of ions into the underlying gate oxide in the fabrication of integrated circuits.

2. Description of the Prior Art

In the manufacture of integrated circuits, it is a conventional process to use a polysilicon gate. The polysilicon is grown at a temperature of about 620° C. until the desired thickness is reached. Since the temperature is held constant throughout the growth of the polysilicon, the polysilicon grains will be column-like. FIGS. 1 and 2 illustrate a partially completed integrated circuit of the prior art in which a layer of silicon oxide 12 has been grown on a semiconductor substrate. Polysilicon layer 14 has been grown at a constant temperature of 620° C., as described above.

In FIG. 1, when B+ or $BF_2+$ ions are implanted 16 into the polysilicon layer 14, the B+ ions easily diffuse through the column-like grain boundaries of the polysilicon into the gate oxide layer 12. Similarly, in FIG. 2, when the polysilicon layer 14 is capped with a tungsten silicide film 18, F— ions easily diffuse through the column-like grain boundaries of the polysilicon into the gate oxide layer 12. As a consequence of this diffusion, the gate oxide effective thickness will be increased. Also, especially in the case illustrated by FIG. 2, electron traps are created within the gate oxide layer. The B+ penetration will cause threshold voltage shift causing device and circuit failure.

The present invention uses a multilayer polysilicon gate with mismatched grain boundaries to confine the ions within the polysilicon and inhibit the penetration of the ions into the underlying gate oxide.

A multilayer concept has been used in a number of patents, although the layers are composed of different materials and/or they are used for different purposes than that of the present invention. U.S. Pat. No. 4,354,309 to Gardiner et al describes a process in which multiple polysilicon layers having differing dopant concentrations are used to limit grain size. U.S. Pat. No. 4,329,706 to Crowder et al details an improved interconnection for integrated circuits using layers of polysilicon and metal silicide. U.S. Pat. No. 5,350,698 to Huang et al describes a self-aligned gate formed of layers of polysilicon and native oxide.

U.S. Pat. No. 4,663,825 to Maeda describes a method for mechanically breaking down a native oxide film formed at the interface of a conducting layer and a wiring layer.

U.S. Pat. No. 4,697,333 to Nakahara teaches a method of preventing penetration of ions by converting some or all of a polysilicon layer to amorphous silicon before ion implantation.

SUMMARY OF THE INVENTION

A principal object of the present invention is to provide a method of forming a polysilicon gate which inhibits penetration of ions through the polysilicon gate to the underlying gate oxide layer.

In accordance with the object of this invention, a method of forming a multilayered polysilicon gate which inhibits penetration of ions through the polysilicon gate to the underlying gate oxide layer is achieved. A gate silicon oxide layer is formed over the surface of a semiconductor substrate. A layer of amorphous silicon is grown overlying the gate silicon oxide layer. A layer of polysilicon is grown over the amorphous silicon layer wherein silicon grain boundaries of the polysilicon layer are misaligned with silicon grain boundaries of the amorphous silicon layer. The amorphous silicon and the polysilicon layers are etched away where they are not covered by a mask to form the multilayered polysilicon gate. The mismatched silicon grain boundaries of the multilayered polysilicon gate inhibit ions from penetrating through the polysilicon gate to the underlying gate oxide layer.

BRIEF DESCRIPTION OF THE DRAWINGS

In the accompanying drawings forming a material part of this description, there is shown.

DESCRIPTION OF THE PREFERRED EMBODIMENTS

Figure 4:
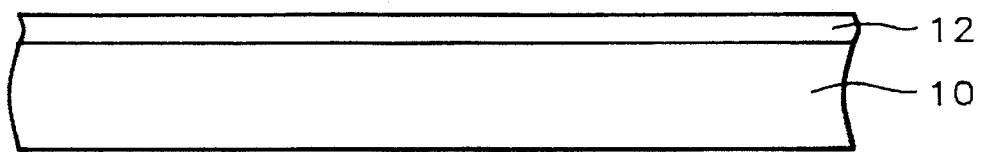
FIGS. 4 through 8 schematically illustrate a cross-sectional representation of a preferred embodiment of the present invention.

Referring now more particularly to FIG. 4, there is shown an illustration of a partially completed integrated circuit. The semiconductor substrate 10 is preferably composed of silicon having a (100) crystallographic orientation. The surface of the silicon substrate 10 is thermally oxidized to form the desired gate silicon oxide 12 thickness. The preferred thickness is between about 60 to 140 Angstroms.

Figure 1:
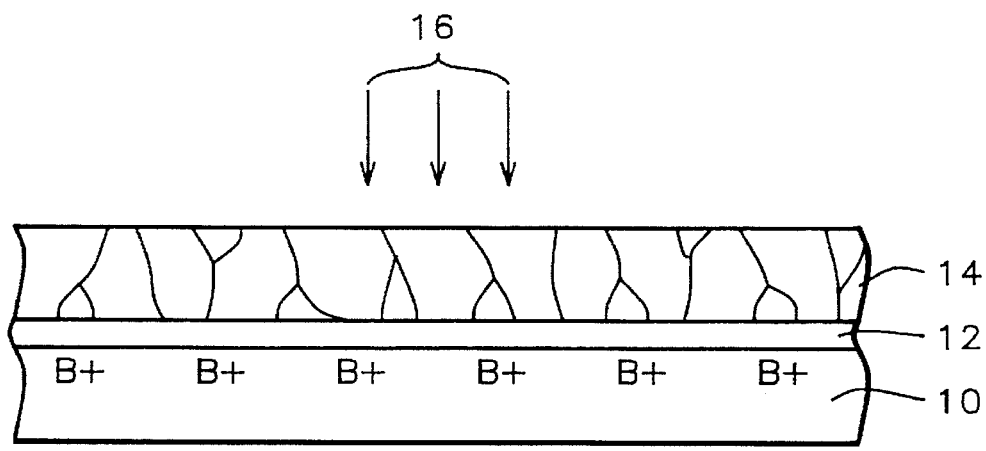
FIGS. 1 and 2 schematically illustrate in cross-sectional representation a process of the prior art.
Figure 2:
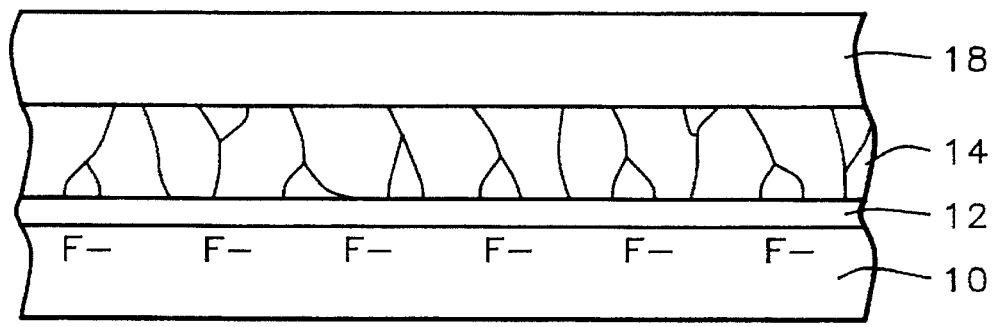
Figure 3:
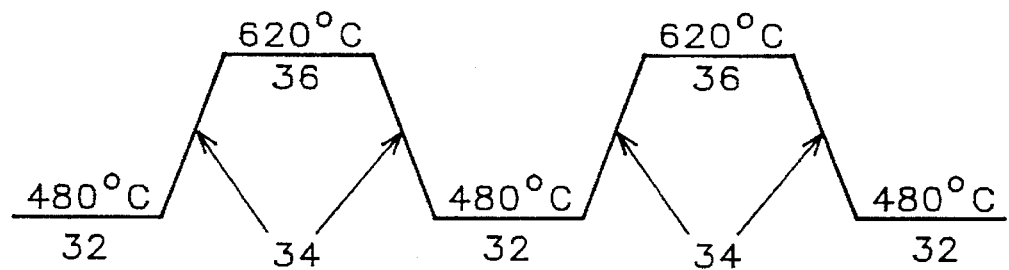
FIG. 3 schematically illustrates in cross-sectional representation the multilayer deposition recipe of the present invention.

Now the multilayer gate structure will be formed using the process diagramed in FIG. 3. Different temperatures are used to form alternating layers of polysilicon. Amorphous-silicon is grown or deposited by low pressure chemical vapor deposition (LPCVD) at between about 480° to 510° C. (32) and polysilicon is grown or deposited by LPCVD at about between about 620° to 650° C. (36). While the temperature is increasing or decreasing, at points 34 on the diagram, the gas lines are turned off so that no silicon is being formed during that time. The amorphous silicon growth uses $Si_2H_6$ gas and $N_2$ gas with flow rates of between about 60 to 100 sccm and 200 to 240 sccm, respectively. The pure polysilicon growth uses $SiH_4$ gas alone with a flow rate of between about 250 to 350 sccm. A pressure of between about 0.2 to 0.3 Torr is maintained throughout the growth cycle.

Figure 5:
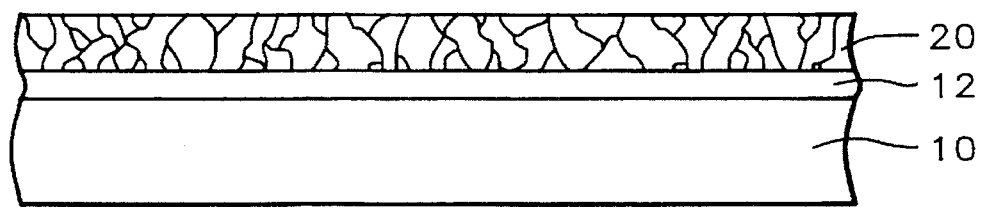
Figure 6:
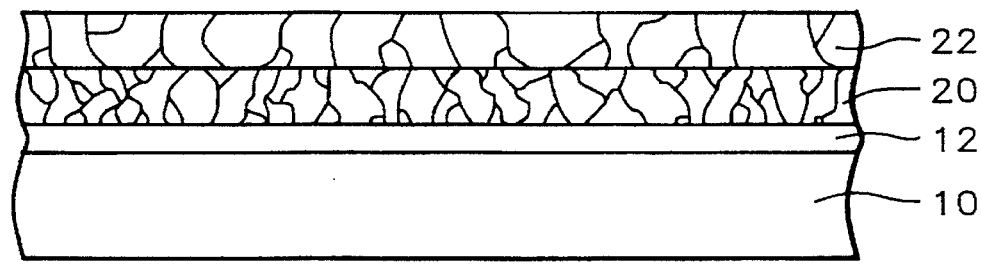

Referring now to FIG. 5, the first layer of amorphous silicon 20 is grown at a temperature of about 480° C. to a thickness of between about 200 to 1000 Angstroms, for example, to about 550 Angstroms. The gas is turned off as the temperature is increased to about 620° C. Then, as shown in FIG. 6, a layer 22 of pure polysilicon is grown to a thickness of between about 500 to 1500 Angstroms, for example, to about 1000 Angstroms.

Figure 7:
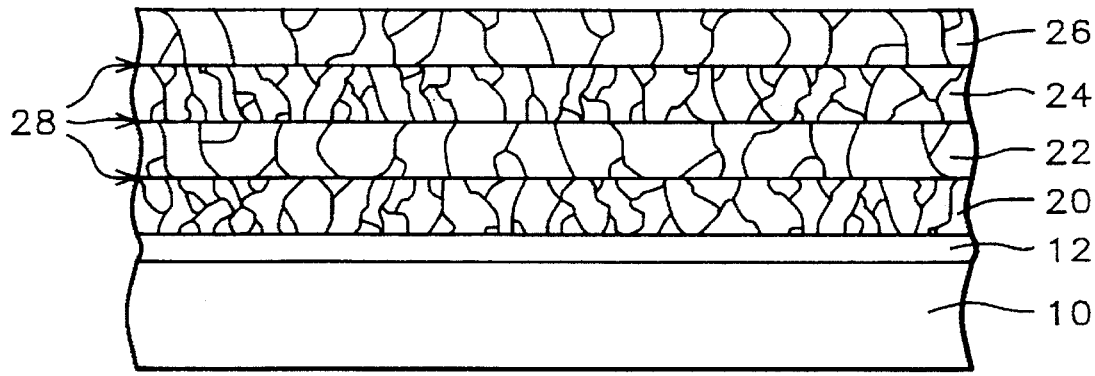

Subsequent layers of amorphous silicon and polysilicon are grown until the completed multilayer polysilicon gate thickness is achieved. This may be between about 1400 to 5000 Angstroms. FIG. 7 illustrates the final structure of the multilayer polysilicon gate. Layers 20 and 24 are amorphous silicon and layers 22 and 26 are polysilicon. The number of interface grain boundary mismatches 28 depends upon the thicknesses of the layers. It is preferred to have more thin layers than to have fewer thick layers. A minimum of three layers is desired. The first layer grown may be polysilicon rather than amorphous silicon. Either polysilicon or amorphous silicon may be the top layer. The key feature of the invention is that the different types of layers alternate.

A layer of tungsten silicide 30 is deposited overlying the topmost polysilicon layer 26. This layer may be composed of $WSi_x$, deposited by chemical vapor deposition to a thickness of between about 1250 to 2000 Angstroms, using $WF_6$ as a precursor. Conventional lithography and etching techniques are applied to pattern the gate structure, as shown in FIG. 8.

B+ or $BF_2$+ ions are implanted into the semiconductor substrate to form source and drain regions 44. The multilayer polysilicon gate is used as a mask for the source and drain implantation. The mismatched grain boundaries of the gate will inhibit the B+ or $BF_2$+ ions from penetrating through the gate to the underlying gate oxide during the next thermal cycle. Likewise, the F+ ions from the tungsten silicide deposition are inhibited by the mismatched grain boundaries of the multilayer gate from penetrating through the gate to the underlying gate oxide. The ions are confined to the layered structure.

The integrated circuit may be completed as is conventional in the art. For example, lightly doped regions 42 and sidewall spacers 40 may be formed, typically before the source and drain implantation 44. An insulating layer 48 of borophosphosilicate glass or the like may be deposited over the semiconductor device structures. Contact openings may be made and a metal or conductive polysilicon layer 50 may be deposited and patterned to form a contact.

Figure 8:
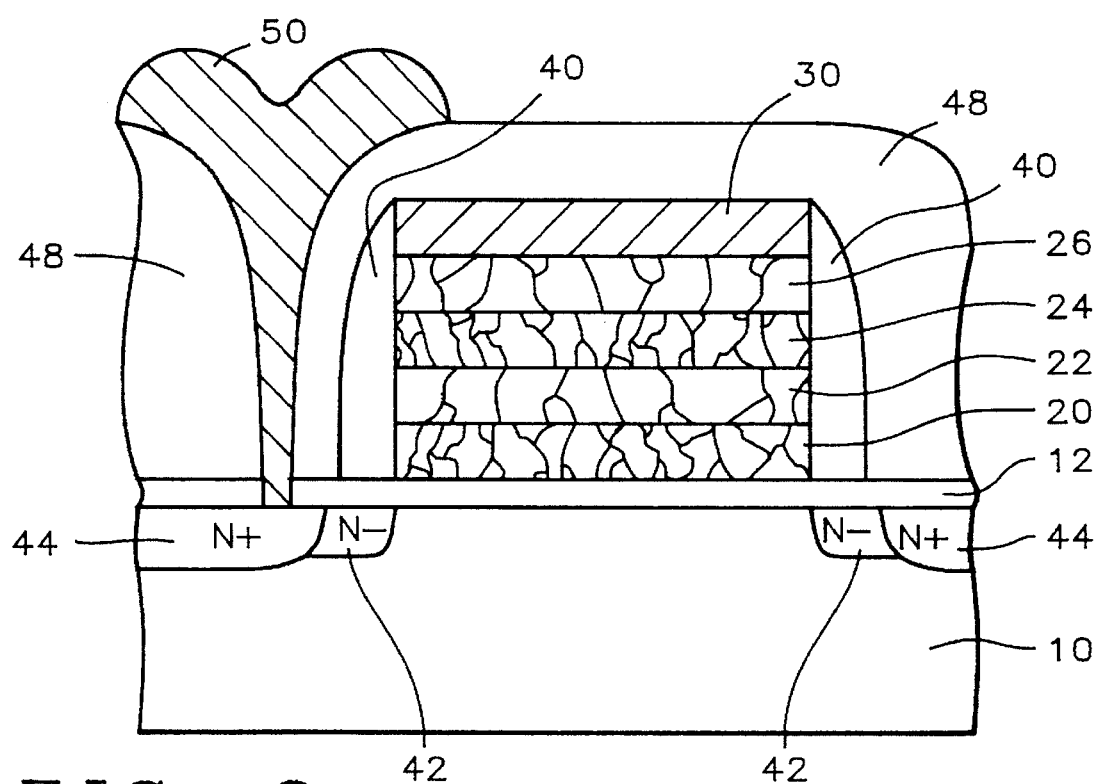

FIG. 8 illustrates an N channel MOSFET integrated circuit device. It is well understood by those in the art that a P channel FET integrated circuit device could be formed by simply substituting opposite polarities to those given for the N channel embodiment. Also, in a similar way, a CMOSFET could be formed by making both N channel and P channel devices upon the same substrate.

EXAMPLE

The following Example is given to show the important features of the invention and to aid in the understanding thereof. Variations may be made by one skilled in the art without departing from the spirit and scope of the invention.

EXAMPLE 1

In this Example, polysilicon gates were made according to a conventional process and according to the process of the invention. In both cases, the gate oxide thickness was 128 Angstroms and a capping tungsten silicide $WSi_x$ layer was 1500 Angstroms thick. The conventional gate was formed of 200 Angstroms of polysilicon. The multilayer gate of the invention was composed of 500 Angstroms of amorphous silicon, 1000 Angstroms of polysilicon, and 500 Angstroms of amorphous silicon.

Figure 9:
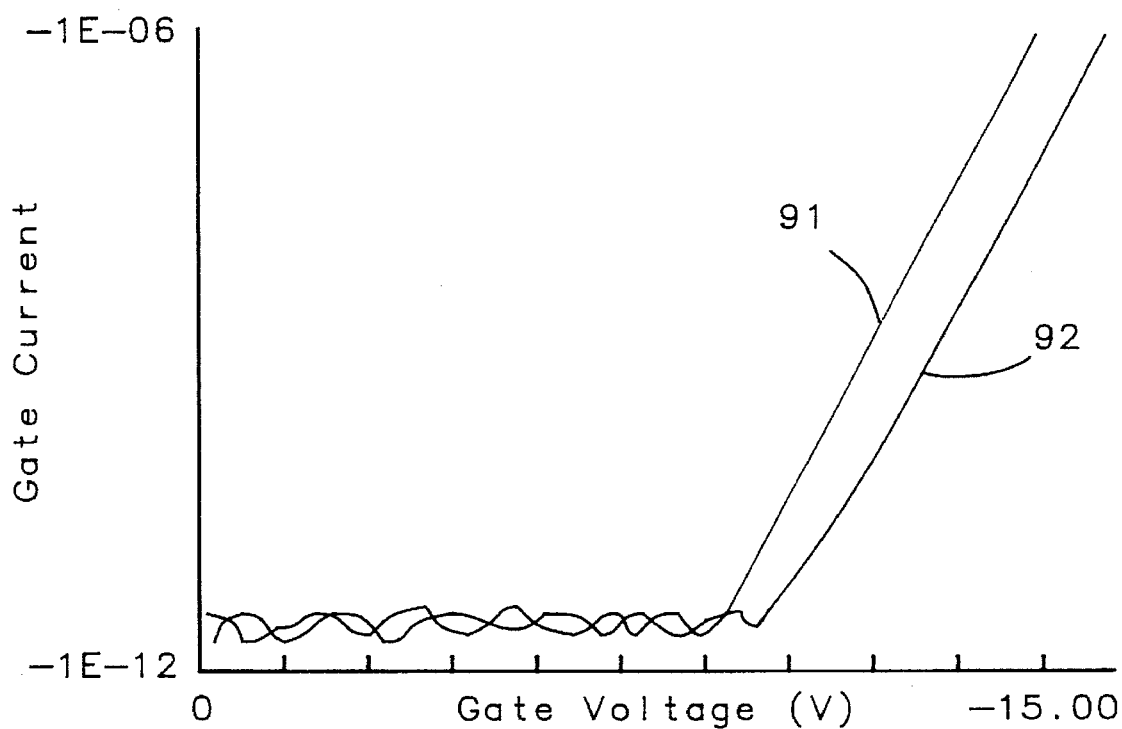
FIGS. 9 and 10 graphically illustrate comparisons between a polysilicon gate of the prior art and a multilayered polysilicon gate formed by the process of the invention.

FIG. 9 graphically illustrates the gate oxide breakdown voltage of the conventional gate 91 versus that of the gate of the present invention 92. It can be seen that the breakdown voltage is higher for the gate of the present invention.

Figure 10:
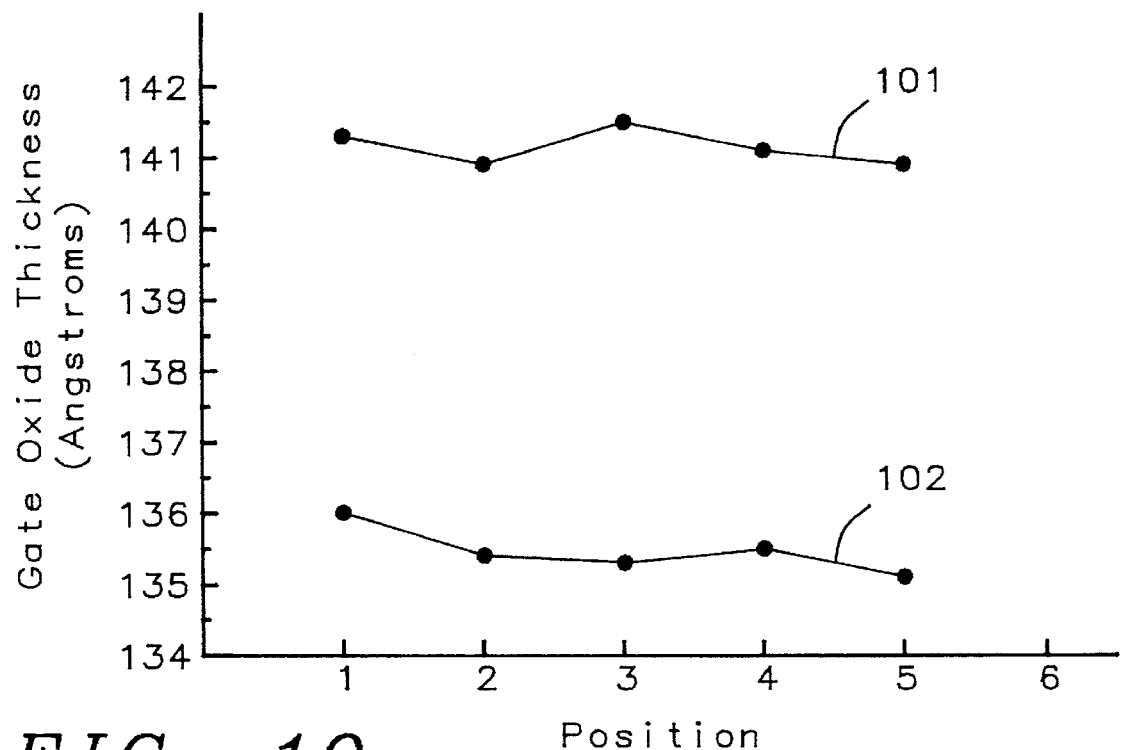

For the same Example, FIG. 10 illustrates the gate oxide thickness versus position for the conventional polysilicon gate 101 and for the multilayered gate of the present invention 102. It can be seen that the increase in gate oxide thickness, from a grown thickness of 128 Angstroms, is much higher for the conventional gate than for the gate of the invention.

Figure 11:
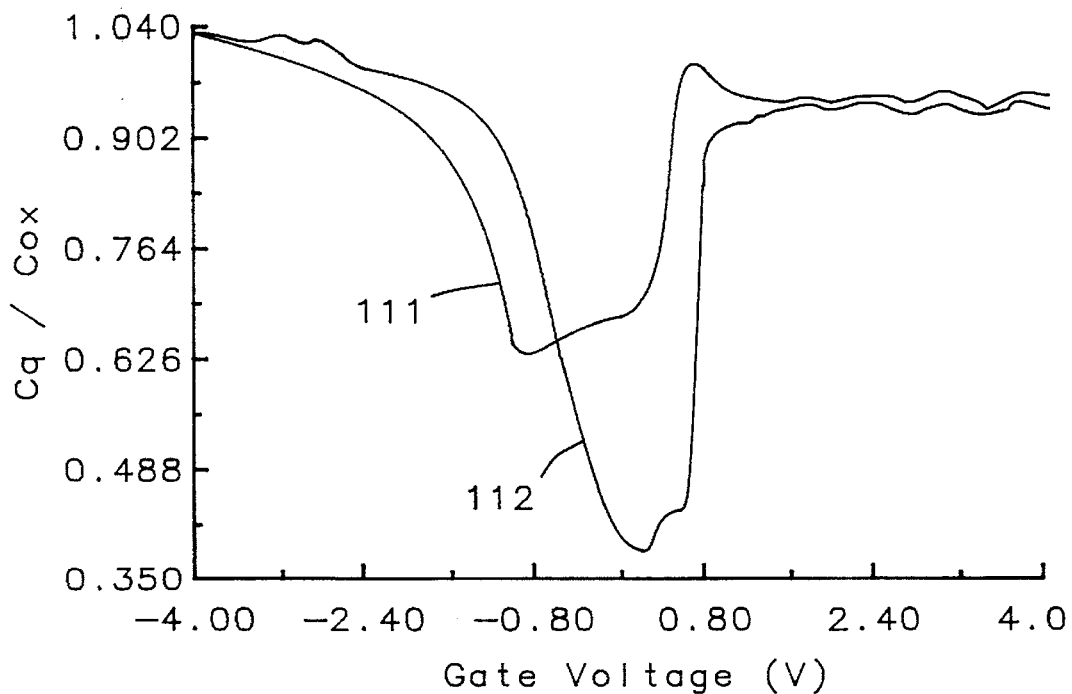
FIG. 11 graphically illustrates gate capacitance versus gate voltage of a polysilicon gate of the prior art.

FIG. 11 illustrates gate voltage versus the gate oxide capacitance measured by high frequency at 100 KHz divided by the gate oxide capacitance measured by a quasi-static electron volt meter for the conventional polysilicon gate. The stress condition is a current density of $-0.05$ A/cm$^2$ for a period of one minute. Line 111 is before stress and line 112 is after stress.

Figure 12:
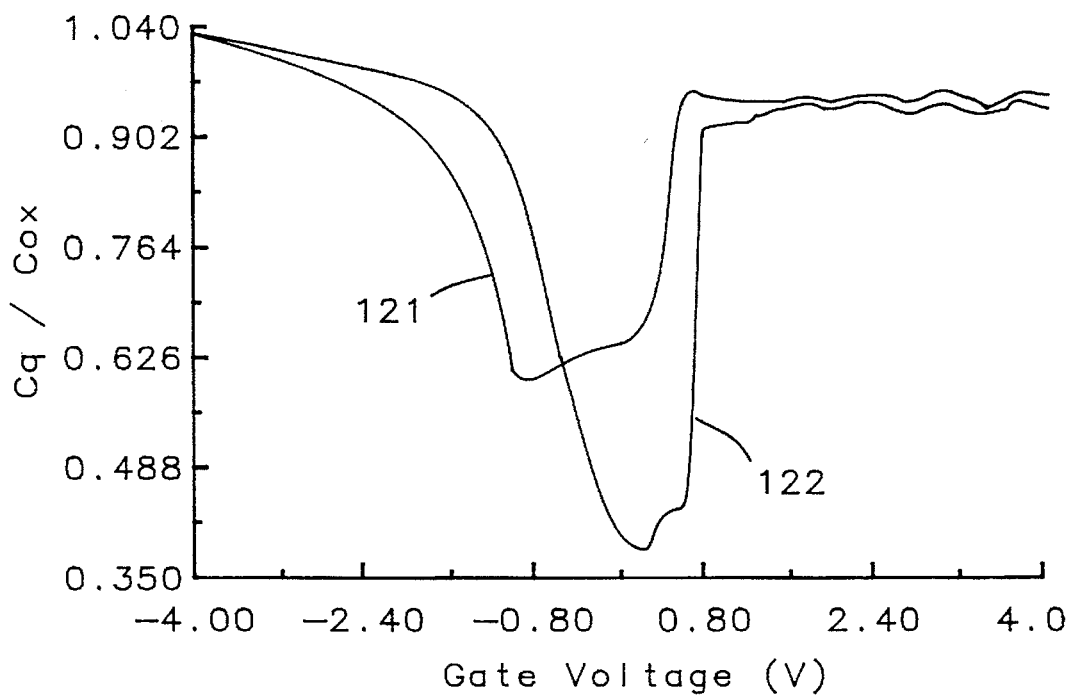
FIG. 12 graphically illustrates gate capacitance versus gate voltage of a multilayered polysilicon gate of the present invention.

FIG. 12 illustrates gate voltage versus the gate oxide capacitance measured by high frequency at 100 KHz divided by the gate oxide capacitance measured by a quasi-static electron volt meter for the multilayered polysilicon gate of the present invention. Line 121 is before stress and line 122 is after stress.

The gate oxide capacitance=$EA$/(gate oxide thickness). Therefore, a thinner gate oxide leads to a larger capacitance. Since the drain saturation current is proportional to the gate oxide capacitance, the drain saturation current will also be large. It can be seen by comparing the graphs in FIGS. 11 and 12 that the minimum value of line 112 (the conventional gate before stress) is the same as the minimum value of line 122 (the multilayered gate before stress). However, the minimum value of line 111 (the conventional gate after stress) is smaller than the minimum value of line 121 (the multilayered gate after stress). This means that the device with the multilayered gate has fewer interface states and less degradation of the gate oxide.

While the invention has been particularly shown and described with reference to the preferred embodiments thereof, it will be understood by those skilled in the art that various changes in form and details may be made without departing from the spirit and scope of the invention.

What is claimed is:

1. A method of forming a multilayered polysilicon gate in an integrated circuit comprising:

forming a gate silicon oxide layer over the surface of a semiconductor substrate;

growing alternating layers of amorphous silicon and polysilicon overlying said gate silicon oxide layer wherein there are grown any number of alternating amorphous silicon and polysilicon layers wherein there are at least three of said polysilicon and said amorphous silicon layers all together wherein said amorphous silicon layers are formed by flowing first gases at a first temperature and wherein said polysilicon layers are formed by flowing second gases at a second temperature where said first gases are different from said second gases and said first temperature is lower than said second temperature and wherein silicon grain boundaries of said polysilicon layers are misaligned with silicon grain boundaries of said amorphous silicon layers; and etching away said amorphous silicon and said polysilicon layers not covered by a mask to form said multilayered polysilicon gate.

2. A method according to claim 1 wherein said amorphous silicon layer is grown at said first temperature of between about 480° to 510° C.

3. A method according to claim 1 wherein said first gases comprise $Si_2H_6$ gas flowed at a rate of between about 60 to 100 sccm and $N_2$ gas flowed at a rate of between about 200 to 240 sccm.

4. A method according to claim 1 wherein said amorphous silicon layer is grown to a thickness of between about 200 to 1000 Angstroms.

5. A method according to claim 1 wherein said polysilicon layer is grown at said second temperature of between about 620° to 650° C.

6. A method according to claim 1 wherein said second gases comprise $SiH_4$ gas flowed at a rate of between about 250 to 350 sccm.

7. A method according to claim 1 wherein said polysilicon layer is grown to a thickness of between about 500 to 1500 Angstroms.

8. A method according to claim 1 further comprising forming a polycide layer overlying topmost said polysilicon layer.

9. A method according to claim 8 wherein said polycide layer is composed of WSi and is deposited using a fluorine ion containing gas to a thickness of between about 1250 and 2000 Angstroms.

10. A method according to claim 9 wherein said mismatched silicon grain boundaries inhibit the penetration of said fluorine ions into said gate silicon oxide layer underlying said multilayered polysilicon gate.

11. A method according to claim 1 wherein boron ions are implanted into said semiconductor substrate and into said multilayered polysilicon gate at a dosage of between 2 E 15 and 4 E 15 atoms/cm$^2$ and energy of between about 50 and 70 KeV to form source and drain regions within said semiconductor substrate.

12. A method according to claim 11 wherein said mismatched silicon grain boundaries inhibit the penetration of said boron ions into said gate silicon oxide layer underlying said multilayered polysilicon gate.

13. The method of claim 1 wherein $BF_2$+ ions are implanted into said semiconductor substrate and into said multilayered polysilicon gate at a dosage of between 2 E 15 and 4 E 15 atoms/cm$^2$ and energy of between about 50 and 70 KeV to form source and drain regions within said semiconductor substrate.

14. A method according to claim 13 wherein said mismatched silicon grain boundaries inhibit the penetration of said $BF_2$+ ions into said gate silicon oxide layer underlying said multilayered polysilicon gate.

15. A method according to claim 1 wherein a pressure of between about 0.2 to 0.3 Torr is maintained throughout the growth of said amorphous silicon and said polysilicon layers.

16. A method of forming a multilayered polysilicon gate in an integrated circuit comprising:

forming a gate silicon oxide layer over the surface of a semiconductor substrate;

growing alternating layers of polysilicon and amorphous silicon overlying said gate silicon oxide layer growing a layer of amorphous silicon over said wherein there are grown any number of alternating amorphous silicon and polysilicon layers wherein there are at least three of said polysilicon and said amorphous silicon layers all together and wherein said amorphous silicon layers are formed by flowing $Si_2H_6$ gas at a rate of between about 60 to 100 sccm and $N_2$ gas at a rate of between about 200 to 240 sccm at a temperature of between about 480° to 510 20 C. and wherein said polysilicon layers are formed by flowing $SiH_4$ gas at a rate of between about 250 to 350 sccm at a temperature of between about 620° to 650° C. and wherein silicon grain boundaries of said amorphous silicon layers are misaligned with silicon grain boundaries of said polysilicon layers; and etching away said alternating polysilicon and amorphous silicon layers not covered by a mask to form said multilayered polysilicon gate.

17. A method according to claim 16 wherein said polysilicon layer is grown to a thickness of between about 500 to 1500 Angstroms.

18. A method according to claim 16 wherein said amorphous silicon layer is grown to a thickness of between about 200 to 1000 Angstroms.

19. A method according to claim 16 further comprising forming a polycide layer overlying the topmost layer of said multilayered polysilicon gate.

20. A method according to claim 19 wherein said polycide layer is composed of WSi and is deposited using a fluorine ion containing gas to a thickness of between about 1250 and 2000 Angstroms.

21. A method according to claim 20 wherein said mismatched silicon grain boundaries inhibit the penetration of said fluorine ions into said gate silicon oxide layer underlying said multilayered polysilicon gate.

22. A method according to claim 16 wherein boron ions are implanted into said semiconductor substrate and into said multilayered polysilicon gate at a dosage of between 2 E 15 and 4 E 15 atoms/cm$^2$ and energy of between about 50 and 70 KeV to form source and drain regions within said semiconductor substrate.

23. A method according to claim 22 wherein said mismatched silicon grain boundaries inhibit the penetration of said boron ions into said gate silicon oxide layer underlying said multilayered polysilicon gate.

24. The method of claim 16 wherein $BF_2$+ ions are implanted into said semiconductor substrate and into said multilayered polysilicon gate at a dosage of between 2 E 15 and 4 E 15 atoms/cm$^2$ and energy of between about 50 and 70 KeV to form source and drain regions within said semiconductor substrate.

25. A method according to claim 24 wherein said mismatched silicon grain boundaries inhibit the penetration of said $BF_2$+ ions into said gate silicon oxide layer underlying said multilayered polysilicon gate.

26. A method according to claim 16 wherein a pressure of between about 0.2 to 0.3 Torr is maintained throughout the growth of said amorphous silicon and said polysilicon layers.

27. A method of forming a multilayered polysilicon gate in an integrated circuit comprising:

forming a gate silicon oxide layer over the surface of a semiconductor substrate;

growing alternating layers of amorphous silicon and polysilicon overlying said gate silicon oxide layer; wherein there are grown any number of alternating amorphous silicon and polysilicon layers wherein there are at least three of said polysilicon and said amorphous silicon layers all together and wherein said amorphous silicon layers are formed by flowing $Si_2H_6$ gas at a rate of between about 60 to 100 sccm and $N_2$ gas at a rate of between about 200 to 240 sccm at a temperature of between about 480° to 510° C. and wherein said polysilicon layers are formed by flowing $SiH_4$ gas at a rate of between about 250 to 350 sccm at a temperature of between about 620° to 650° C. and wherein silicon grain boundaries of said polysilicon layers are misaligned with silicon grain boundaries of said amorphous silicon layers;

etching away said amorphous silicon and said polysilicon layers not covered by a mask to form said multilayered polysilicon gate;

depositing a silicide layer overlying said multilayered polysilicon gate;

forming source and drain regions within said semiconductor substrate;

depositing an insulating layer overlying said multilayered polysilicon gate;

providing contact openings through said insulating layer to said source and drain regions;

depositing and patterning a conducting layer overlying said insulating layer and within said contact openings; and completing fabrication of said integrated circuit.

28. A method according to claim 27 wherein said gate silicon oxide layer has a thickness of between about 60 to 140 Angstroms.

29. A method according to claim 27 wherein said amorphous silicon layer is grown to a thickness of between about 200 to 1000 Angstroms.

30. A method according to claim 27 wherein said polysilicon layer is grown to a thickness of between about 500 to 1500 Angstroms.

31. A method according to claim 27 wherein said silicide layer is composed of WSi and is deposited using a fluorine ion containing gas to a thickness of between about 1250 and 2000 Angstroms.

32. A method according to claim 31 wherein said mismatched silicon grain boundaries inhibit the penetration of fluorine ions into said gate silicon oxide layer underlying said multilayered polysilicon gate.

33. A method according to claim 27 wherein said source and drain regions are formed by implanting boron ions into said semiconductor substrate wherein said boron ions also are implanted into said multilayered polysilicon gate at a dosage of between 2 E 15 and 4 E 15 atoms/cm$^2$ and energy of between about 50 and 70 KeV.

34. A method according to claim 33 wherein said mismatched silicon grain boundaries inhibit the penetration of said boron ions into said gate silicon oxide layer underlying said multilayered polysilicon gate.

35. The method of claim 27 wherein said source and drain regions are formed by implanting $BF_2+$ ions into said semiconductor substrate wherein said $BF_2+$ ions also are implanted into said multilayered polysilicon gate at a dosage of between 2 E 15 and 4 E 15 atoms/cm$^2$ and energy of between about 50 and 70 KeV.

36. A method according to claim 35 wherein said mismatched silicon grain boundaries inhibit the penetration of said $BF_2+$ ions into said gate silicon oxide layer underlying said multilayered polysilicon gate.

37. A method according to claim 27 wherein a pressure of between about 0.2 to 0.3 Torr is maintained throughout the growth of said amorphous silicon and said polysilicon layers.

* * * * *

UNITED STATES PATENT AND TRADEMARK OFFICE
CERTIFICATE OF CORRECTION

PATENT NO. : 5,652,156
DATED : 7/29/97
INVENTOR(S) : SIU-HAN LIAO, JIAW-REN SHIH

It is certified that error appears in the above-indentified patent and that said Letters Patent is hereby corrected as shown below:   Title page:

Item (75) correct Inventor's name from "Shih Jiaw-Ren" to --Jiaw-Ren Shih--

Signed and Sealed this

Ninth Day of December, 1997

Attest:

BRUCE LEHMAN

*Attesting Officer*           *Commissioner of Patents and Trademarks*